(12) United States Patent
Master et al.

(10) Patent No.: US 6,371,310 B1
(45) Date of Patent: Apr. 16, 2002

(54) BOAT FOR LAND GRID ARRAY PACKAGES

(75) Inventors: Raj N. Master; Mohammad Z. Khan, both of San Jose, CA (US); L. K. Teoh, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/740,838

(22) Filed: Dec. 21, 2000

Related U.S. Application Data

(60) Provisional application No. 60/216,630, filed on Jul. 7, 2000.

(51) Int. Cl.[7] ................ A47F 7/00; B65D 73/02; B65D 85/00

(52) U.S. Cl. .............. 211/41.18; 211/26; 206/486; 206/725

(58) Field of Search ................. 211/26, 41.18, 211/40; 206/454, 724, 725, 562, 563, 564, 486

(56) References Cited

U.S. PATENT DOCUMENTS

| 5,131,535 | A | * | 7/1992 | O'Connor et al. | ...... 206/486 X |
| 5,392,932 | A | * | 2/1995 | Vongfangfoo | ................ 211/26 |
| 5,462,177 | A | * | 10/1995 | O'Donnell | |
| 5,547,082 | A | * | 8/1996 | Royer et al. | ................ 206/725 |
| 5,848,703 | A | * | 12/1998 | Murphy et al. | ............ 206/725 |
| 5,988,405 | A | * | 11/1999 | Weisenburger | ............... 211/40 |
| 6,021,904 | A | * | 2/2000 | Kozol et al. | ................ 206/724 |
| 6,227,372 | B1 | * | 5/2001 | Thomas et al. | ............. 206/725 |

* cited by examiner

*Primary Examiner*—Robert W. Gibson, Jr.

(57) ABSTRACT

A boat is formed with layers comprising substantially aligned holes for safely accommodating land grid array semiconductor packages during assembly. The boat includes a bottom layer with an array of through-holes having a substantially square cross-sectional shape with rounded corners, a middle layer with an array of through-holes having a substantially octagonal cross-sectional shape and a top layer having an array of through-holes having a substantially square cross-sectional shape with notched sides and vertical tabs extending upwardly from the sidewalls of each notched side. The layers may be attached by spot welding or other means.

16 Claims, 3 Drawing Sheets

BOAT FOR LAND GRID ARRAY PACKAGES

RELATED APPLICATIONS

This application claims priority from U.S. Provisional Patent Application Ser. No. 60/216,630, filed on Jul. 7, 2000, entitled: "Boat for Land Grid Array Packages", the entire disclosure of which is hereby incorporated by reference therein.

TECHNICAL FIELD

The present invention relates to the field of semiconductor packaging, and more specifically to a boat for holding land grid array semiconductor packages during assembly.

BACKGROUND ART

Conventional land grid array semiconductor packages typically comprise a matrix of electronically conductive pads disposed on a substrate surface for coupling between the substrate and a semiconductor chip, printed circuit board or other components. The conductive pads are commonly gold or nickel plated and may be distributed over all or part of the substrate surface, up to the outer edges.

In order to increase package production throughput and efficiency, conventional carrying devices, such as trays or boats, are typically employed to hold semiconductor packages during and between various assembly steps. Individual semiconductor packages are held in pockets cut out of the carrying device.

In accordance with conventional packaging techniques, land grid array packages are held during assembly in carrying device pockets designed to support each package via the package's outer edges. For many semiconductor package types, such as pin grid array packages, this approach is acceptable either because the surface attachments are located on the semiconductor package in a manner that keeps the semiconductor package edges free or because the semiconductor package does not have surface attachments.

The surface of land grid array packages, however, differs in that the entire surface may be populated with metal-plated conductive pads. As a result, there is often insufficient distance between the outermost conductive pads and the edge of the land grid array package to support them by their outer edges in a conventional carrying device pocket without causing the rows of conductive pads closest to the four outer edges of the land grid array package surface to come into contact with the carrying device. Such contact with the carrying device is problematic because it causes contamination and/or damage as by scratching of the conductive pads, thereby adversely impacting device performance. For example, impressions in the conductive pads result in solder voids; as when solder balls or other parts are attached, that impede mechanical or electrical functions.

Another problem frequently encountered upon employing conventional carrying devices to accommodate land grid array packages stems from the fact that land grid array packages are light in weight. As land grid array packages pass through the assembly process, the carrying devices holding these packages are subject to movement that can cause a land grid array package to bounce or jump in the carrying device pocket. The conventional carrying devices currently employed to support land grid array packages have relatively shallow holding pockets and no containment feature, such as a lid. This carrying device design feature, combined with the land grid array package's light weight, create an unstable situation such that even minimal carrying device movement results in ejection or discharge of a land grid array package completely out of the carrying device or unseating of the land grid array package so that it sits askew in the carrying device pocket Land grid array package manufacturers, therefore, experience reduced yield rates and increased rework stemming from conventional carrying device-related damage.

Conventional carrying device pockets are not designed to address package size variations, thereby exacerbating damage and package jumping. For example, conventional land grid array packages are manufactured in a variety of dimensions, as known in the art. In situations wherein the carrying device pocket is larger than the land grid array package, the likelihood that the package will slide around within the pocket is increased, thereby rendering more conductive pads than just those in the outermost rows of the land grid array package vulnerable to contact with the carrying device and damage.

The larger carrying device pocket size is also conducive to package jumping and damage. The pockets in conventional carrying devices typically have sharp edges around the top and bottom pocket openings and support shelf areas. These sharp edges can scratch or otherwise damage semiconductor packages if the packages are not carefully placed in the pocket. Land grid array packages present special concerns because their weight makes them susceptible to being dislodged from conventional carrying devices during handling, even when the carrying device pocket size is appropriate. When the carrying device pocket is oversized with respect to the land grid array package, jumping becomes even more likely, thus exposing the land grid array package to contact with the sharp edges of the pocket. In addition to exposing the conductive pads and other package parts to scratching and denting, excess movement and jumping can be especially damaging to ceramic land grid array packages that are prone to breaking when they strike other hard objects, like a carrying device.

There is a need for a carrying device that can hold land grid array packages in place during assembly without contaminating, scratching, denting or otherwise damaging the conductive pads or other parts on the land grid array package or the land grid array package itself.

SUMMARY OF THE INVENTION

The present invention addresses and solves the above-mentioned problems attendant upon accommodating land grid array packages during assembly by providing a boat comprising a plurality of layers with aligned through-holes. The through-holes in each layer are strategically designed to provide secure, safe accommodation for a land grid array semiconductor package. Embodiments of the present invention comprise a boat having a bottom layer with an array of through-holes having a substantially square cross-sectional shape with rounded corners, a middle layer with an array of through-holes having a substantially octagonal cross-sectional shape and a top layer having an array of through-holes having a substantially square cross-sectional shape with notched sides. Vertical tabs extend upward from the sidewalls of each notched side. The cross-sectional area of each middle layer through-hole is larger than the cross-sectional area of each bottom layer through-hole and the cross-sectional area of each top layer through-hole is larger than the cross-sectional area of each middle layer through-hole. The through-holes in the bottom layer, middle layer and top layer each have a central axis. Each middle layer through-hole central axis is substantially aligned with the central axis of a corresponding bottom layer through-hole. Each top layer through-hole central axis is substantially aligned with the central axis of a corresponding middle layer through-hole. The middle layer is attached to the bottom layer so that the middle layer through-holes are substantially aligned over the bottom layer through-holes, thus forming octagonal frames around the bottom layer through-holes exposing a resting area comprising a portion of the bottom layer's upper surface. The top layer is attached to the middle layer so that the top layer through-holes are substantially aligned over the middle layer through-holes, thus exposing four corner supports on the upper surface of the middle layer. The layers may be attached by spot welding or other means.

The present invention advantageously eliminates contact between the boat and critical land grid array package conductive pads, thereby improving the quality of the land grid array flip chip packages assembled using the present invention by reducing instances of damage to such conductive pads. Boats in accordance with embodiments of the present invention also accommodate a variety of land grid array package sizes, thereby advantageously improving production speed and reducing production costs by eliminating the need for multiple boats of varying design to complete package assembly.

Boats in accordance with embodiments of the present invention effectively retain land grid array packages in place during movement through the assembly process, advantageously reducing damage due to boat dislodgment, or improper seating, such as scratching or contamination. The present invention also enables superior alignment between land grid array packages and assembly equipment during component placement, thereby increasing accuracy in land grid array package production and increasing output quality.

Other advantages of the present invention will become readily apparent to those skilled in the art from the following detailed description. The embodiment shown and described provides illustration of the best mode contemplated for carrying out the invention. The invention is capable of modification in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

The present invention addresses and solves problems related to moving land grid array packages through the assembly process by avoiding damage to them either as a result of the land grid array packages becoming dislodged from a boat or being exposed to unwanted contact with the boat. The present invention protects land grid array packages from damage by reducing or eliminating incidents where a land grid array package flips out of the boat or becomes improperly seated, as when a land grid array package sits askew in the boat during assembly. The present invention also limits unwanted contact between the boat and the conductive pads on the land grid array package that is not possible with conventional carrying devices. These benefits are achieved by the supporting and retaining capabilities of the present invention.

Embodiments of the present invention comprise a boat having a bottom layer, a middle layer and a top layer each with an array of through-holes having a shape unique to the particular layer. The layers are positioned so that when the middle layer is attached to the bottom layer and the top layer is attached to the middle layer, the central axes of overlying through-holes in each layer are substantially aligned. An embodiment of the present invention is schematically illustrated in FIGS. 1–6, wherein similar features bear similar references.

Figure 1:
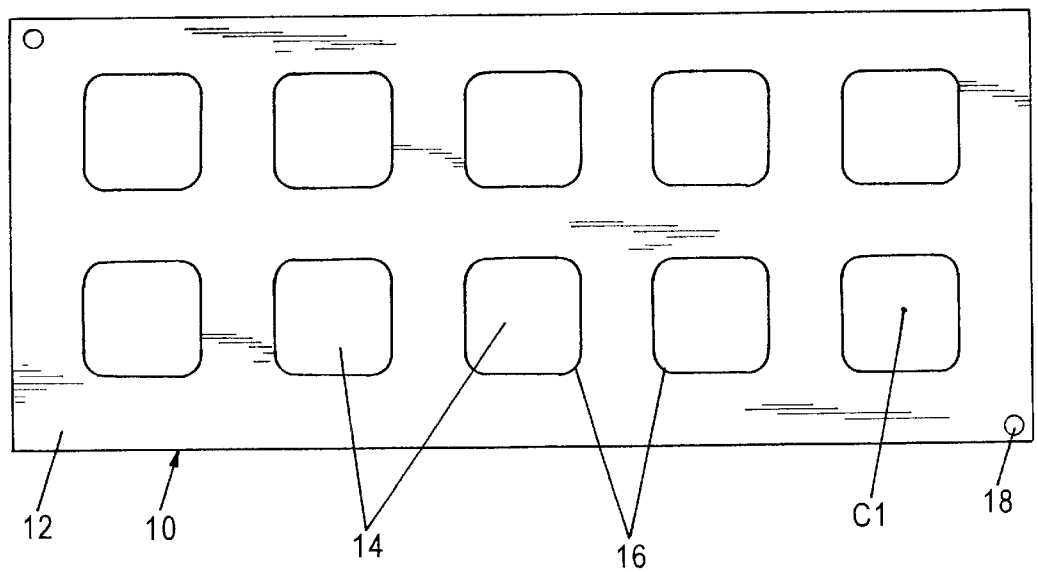
FIG. 1 is a top view of the bottom layer of a boat in accordance with an embodiment of the present invention.

FIG. 1 depicts a top view of a bottom layer 10 having an upper surface 12 and a lower surface (not visible). The bottom layer 10 includes an array of through-holes 14 having a substantially square cross-section with rounded corners 16, each through-hole 14 having a central axis C1.

The bottom layer through-holes 14 are sized to prevent small land grid array packages from falling through them, thereby advantageously allowing the same boat to be used to carry a variety of land grid array package designs through the assembly process. The rounded corners 16 of the bottom layer through-holes 14 beneficially protect land grid array packages, particularly ceramic land grid array packages, from breaking, shattering or otherwise being damaged vis-à-vis conventional pockets having sharp edges.

The bottom layer through-holes 14 are spaced apart so that a land grid array package will not come into contact with any other land grid array packages placed in the same boat, thereby preventing damage that would otherwise occur when land grid array packages come into contact with other objects, including other semiconductor packages. In an embodiment of the present invention, the through-holes 14 in the bottom layer 10 are substantially equidistant from each other.

The bottom layer 10 further includes alignment holes 18, which assist in aligning a land grid array package and components, such as a die, during component placement.

Figure 2:
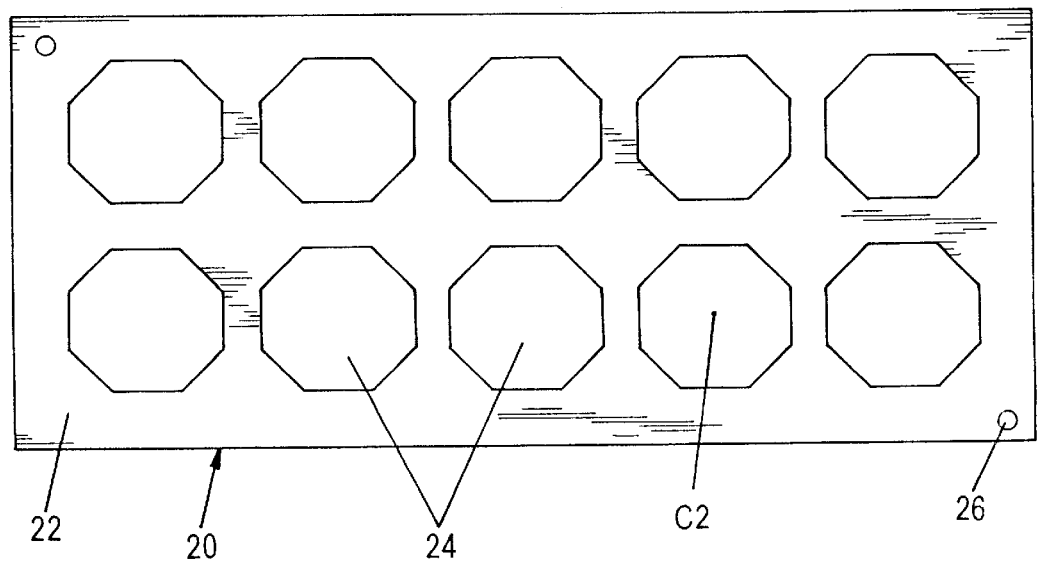
FIG. 2 is a plan view of the middle layer of a boat in accordance with an embodiment of the present invention.

Referring to FIG. 2, a top view of an embodiment of the present invention shows the middle layer 20 of a boat, having upper surface 22 and a lower surface (not visible). The middle layer 20 reflects an array of through-holes 24 with a substantially octagonal cross-sectional shape. In an embodiment of the present invention, the middle layer through-holes 24 are substantially aquidistant from each other. The middle layer through-holes 24 depicted in FIG. 2 each have a central axis C2 that is substantially aligned with the central axis C1 of an underlying bottom layer through-hole 14. Further, the middle layer through-holes 24 have a cross-sectional area that is larger than the cross-sectional area of the bottom layer through-holes 14. The middle layer 20 includes alignment holes 26 substantially overlapping the bottom layer alignment holes 18.

Figure 3:
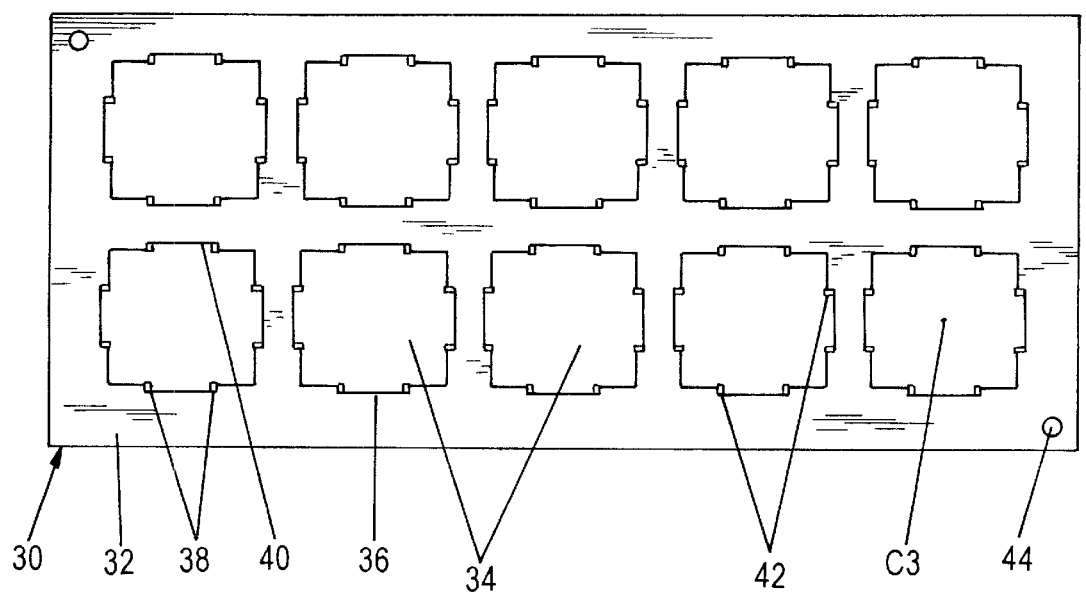
FIG. 3 illustrates a plan view of the top layer in accordance with an embodiment of the present invention.

As illustrated in FIG. 3, an embodiment of the present invention includes a top layer 30 having an upper surface 32 and a lower surface (not visible). The top layer 30 has an array of through-holes 34 having a substantially square cross-sectional shape with notched sides 36. In an embodiment of the present invention, the top layer through-holes 34 are substantially equidistant from each other.

Each notched side 36 comprises two opposing side walls 38 and a rear wall 40. A vertical tab 42 extends upwardly from each side wall 38 substantially perpendicular to the upper surface 32 of the top layer 30. These vertical tabs 42 prevent land grid array packages from flying out of the boat when the boat is jostled, jarrred or otherwise moved during assembly. The tabs 42 also help to guide and maintain land grid array packages into a properly seated position in the boat, both when a land grid array package is first placed in the boat and when the boat is moved, vis-à-vis conventional carrying devices in which such packages easily become askew resulting in production errors.

Each top layer through-hole 34 has a cross-sectional area that is larger than the cross-sectional area of each middle layer through-hole 24. In addition, each top layer through-hole 34 has a central axis C3 substantially aligned with the central axis C2 of an underlying middle layer through-hole 24.

As shown in FIG. 3, the top layer 30 includes alignment holes 44, substantially overlapping the middle layer alignment holes 26.

Figure 4:
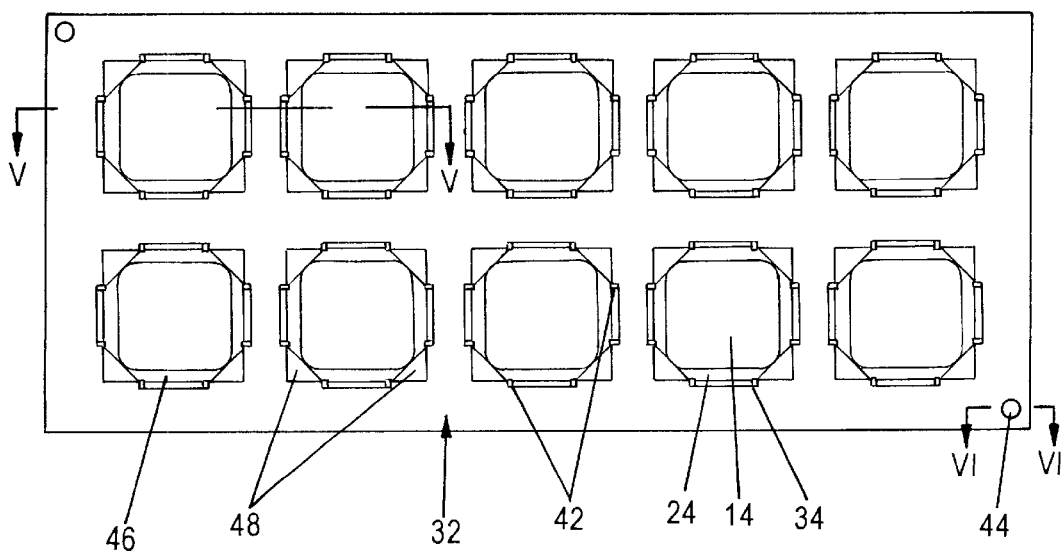
FIG. 4 shows a top view of a boat, in accordance with an embodiment of the present invention, where the middle layer of FIG. 2 is attached to the bottom layer of FIG. 1 and the top layer of FIG. 3 is attached to the middle layer of FIG. 2.

An embodiment of the present invention is illustrated in FIG. 4 and comprises a boat wherein the lower surface of the middle layer 20 is attached to the upper surface 12 of the bottom layer 10 so that each middle layer through-hole 24 is aligned over a corresponding bottom layer through-hole 14, to form a substantially octagonal frame around each bottom layer through-hole 14 exposing a resting area 46 comprising a portion of the upper surface 12 of the bottom layer 10. As shown in FIG. 4, the top layer 30 is placed on the middle layer 20 such that each top layer through-hole 34 is aligned over a corresponding middle layer through-hole 24. In an embodiment of the present invention, four corner supports 48 are exposed through each top layer through-hole 34, formed by the upper surface 22 of the middle layer 20 remaining exposed once the top layer 30 is placed on the middle layer 20.

Once the bottom layer 10, middle layer 20, and top layer 30 are substantially aligned, the layers are attached together to form a boat. The layers may be attached by any of various ways, as by spot welding, with adhesives or through the use of pins, bolts, clamps, screws or other means. The resulting boat has a two-tiered support structure capable of securely holding land grid array packages in place during assembly. A land grid array package is placed in the present invention and allowed to rest on the corner supports 48, thereby ensuring that only the conductive pads on the outermost corners of a land grid array package come into contact with the boat. While these corner conductive pads may suffer some damage due to contact with the corner supports 48, land grid array package performance is not materially affected vis-à-vis conventional methods whereby the entire outer rows of conductive pads on a land grid array package come into contact with the carrying device.

The resting area 46 serves as another land grid array package support area and helps to retain land grid array packages in the boat when they become unseated from the corner supports 48, as may occur if the boat is jostled or bumped during assembly, thereby advantageously reducing package loss and damage. The resting area 46 also serves the primary support area for land grid array packages that are too small to rest on the corner supports 48, thereby advantageously allowing semiconductor device manufacturers to increase manufacturing through-put and reduce production costs by employing a single boat design instead of multiple boats with varying pocket sizes to accommodate different sized land grid array packages, as with conventional carrying devices.

Figure 5:
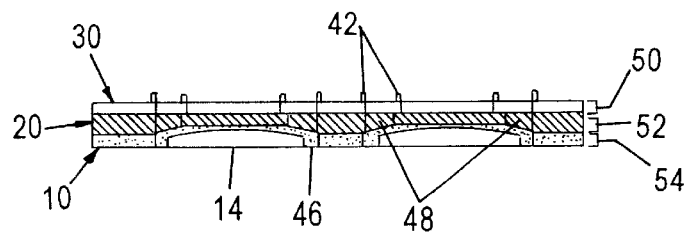
FIG. 5 depicts a cross-section of the boat of FIG. 4 taken along line V—V, in accordance with an embodiment of the present invention.

A cross section of an embodiment of the present invention is illustrated in FIG. 5 and comprises a boat wherein each top layer through-hole 34 has a depth 50 of at least one-half the thickness of a land grid array package, e.g., conventional land grid array packages of typical thickness dimensions as known in the art. Accordingly, top layer through-hole 34 would have a depth 50 that accommodates conventional land grid array package thickness dimensions, thereby securely retaining the package to avoid ejection during movement.

With continued reference to FIG. 5, each middle layer through-hole 24 has a depth 52 sufficient to allow a land grid array package to sit on the corner supports 48 without any part of the land grid package, coming into contact with the resting area 46. Similarly, each bottom layer through-hole 14 has a depth 54 sufficient to allow a land grid array package to sit on the resting area 46 with the package bottom facing downward without any part of the land grid package extending below the bottom layer through-hole 14. For example, when a land grid array package is seated, with the conductive pads extending downward at conventional lengths. Thus, the depth 52 of a middle layer through-hole 24 or the depth 54 of a bottom layer through-hole 14 accommodates conventional land grid array package dimensions, thereby ensuring that the conductive pads are not scratched, contaminated, dented or otherwise damaged during assembly.

Figure 6:
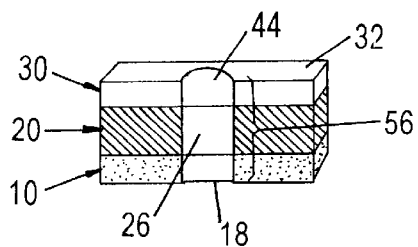
FIG. 6 depicts a cross-section of a portion of the boat of FIG. 4 taken along VI—VI showing an alignment hole combination, in accordance with an embodiment of the present invention.

Adverting to the embodiment of the present invention illustrated in FIG. 6, the top layer alignment hole 44 substantially corresponds to and overlaps the middle layer alignment hole 26 and the lower layer alignment hole 18 to form an alignment hole combination 56 that passes through the boat. This alignment hole combination complements alignment mechanisms in machines used to assemble land grid array packages. When the alignment hole combination 56 is lined up with an alignment mechanism in an assembly machine, it ensures that the assembly machine performs its function, such as die or other component placement, on the correct portion of the land grid array package, thus beneficially reducing the need for rework and improving output rates through the use of high-speed automation in the assembly process.

Embodiments of the present invention include boats wherein the bottom layer 10, middle layer 20 and top layer 30 are made from a material resistant to warpage, softening, or melting at temperatures of about 200° C. to about 450° C. The boat of the present invention may comprise one or more materials. It will be appreciated that other materials suitable for forming relatively thin, sturdy, heat resistant structures can be used to form the boat.

The present invention enjoys industrial applicability in fabricating any of various types of semiconductor packages. The present invention has particular applicability in packaging land grid array semiconductor packages.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A boat for holding land grid array packages, the boat comprising:

a bottom layer having an upper surface, a lower surface and an array of through-holes having a substantially square cross-sectional shape with rounded corners;

a middle layer having an upper surface, a lower surface and an array of through-holes having a substantially octagonal cross-sectional shape;

a top layer having an upper surface, a lower surface and an array of through-holes having a substantially square cross-sectional shape with notched sides; and two or more alignment hole combinations for locating the boat within assembly equipment.

2. The boat according to claim 1, wherein the bottom layer through-holes are spaced apart so that each land grid array semiconductor package placed in the boat is in a non-contacting relationship with any other land grid array semiconductor package placed in the same boat.

3. The boat according to claim 1, wherein each middle layer through-hole has a central axis and each bottom layer through-hole has a central axis substantially aligned with the central axis of a middle layer through-hole.

4. The boat according to claim 3, wherein the middle layer through-holes have a cross-sectional area larger than the cross-sectional area of the bottom layer through-holes.

5. The boat according to claim 1, wherein each top layer through-hole has a central axis substantially aligned with the central axis of the middle layer through-holes.

6. The boat according to claim 5, wherein the top layer through-holes have a cross-sectional area larger than the cross-sectional area of the middle layer through-holes.

7. The boat according to clam 6, wherein each notched side of the top layer through-holes comprises:

two opposing sidewalls;

a rear wall; and a vertical tab extending upwardly from each sidewall substantially perpendicular to the upper surface of the top layer.

8. The boat according to claim 1, wherein the middle layer is attached to the bottom layer so that each middle layer through-hole is aligned over a corresponding bottom layer through-hole with each middle layer through-hole forming a substantially octagonal frame around the corresponding bottom layer through-hole exposing a resting area comprising a portion of the upper surface of the lower layer about the lower layer through-hole.

9. The boat according to claim 8, wherein the top layer is attached to the middle layer so that each top layer through-hole is aligned over a corresponding middle layer through-hole with each top layer through-hole exposing four corner supports on the upper surface of the middle layer, about the middle layer through-hole.

10. The boat according to claim 9, wherein the layers are attached via spot welding.

11. The boat according to claim 1, wherein the layers comprise a material resistant to warpage, softening, or melting at a temperature of about 200° C. to about 450° C.

12. The boat according to claim 2, wherein the through-holes in each layer are substantially equidistant from each other.

13. The boat according to claim 1, wherein each alignment hole combination comprises:

an alignment hole in the bottom layer;

an alignment hole in the middle layer, wherein the placement of the middle layer alignment hole substantially corresponds to and overlaps the bottom layer alignment hole; and an alignment hole in the top layer, wherein the placement of the top layer alignment hole substantially corresponds to and overlaps the middle layer alignment hole.

14. The boat according to claim 1, wherein each top layer through-hole has a depth of at least one-half the thickness of a land grid array package.

15. The boat according to claim 1, wherein each middle layer through-hole has a depth sufficient to allow a land grid array package to sit on the corner supports without any part of the land grid package coming into contact with the resting area.

16. The boat according to claim 1, wherein each bottom layer through-hole has a depth sufficient to allow a land grid array package to sit on the resting area with the package bottom facing downwardly without any part of the land grid package extending below the bottom layer through-hole.

* * * * *